(12) United States Patent
Torii

(10) Patent No.: US 8,143,645 B2
(45) Date of Patent: Mar. 27, 2012

(54) SEMICONDUCTOR DEVICE HAVING A STACKED MULTI STRUCTURE THAT HAS LAYERED INSULATED GATE-TYPE BIPOLAR TRANSISTORS

(75) Inventor: Katsuyuki Torii, Niiza (JP)

(73) Assignee: Sanken Electric Co., Ltd., Niiza-shi (JP)

( * ) Notice: Subject to any disclaimer, the term of this patent is extended or adjusted under 35 U.S.C. 154(b) by 211 days.

(21) Appl. No.: 11/995,360

(22) PCT Filed: Mar. 22, 2006

(86) PCT No.: PCT/JP2006/305703
§ 371 (c)(1),
(2), (4) Date: Jan. 11, 2008

(87) PCT Pub. No.: WO2007/010646
PCT Pub. Date: Jan. 25, 2007

(65) Prior Publication Data
US 2009/0140289 A1 Jun. 4, 2009

(30) Foreign Application Priority Data
Jul. 15, 2005 (JP) .................. 2005-207685

(51) Int. Cl.
*H01L 29/739* (2006.01)
(52) U.S. Cl. ........ 257/143; 257/181; 257/288; 257/341; 257/356; 257/401; 257/684; 257/676; 257/686; 257/688; 257/689; 257/712; 257/777; 257/E29.197; 257/E25.027; 257/E21.614
(58) Field of Classification Search ................ 257/143, 257/177, 718, E29.197, 181, 288, 341, 356, 257/401, 684, 676, 686, 688, 689, 712, 777, E25.027, E21.614
See application file for complete search history.

(56) References Cited

U.S. PATENT DOCUMENTS

| | | | | |
|---|---|---|---|---|
| 6,051,850 A * | 4/2000 | Park | ............. | 257/133 |
| 6,055,148 A * | 4/2000 | Grover | ............. | 361/103 |
| 6,081,039 A | 6/2000 | Furnival | | |
| 6,642,576 B1 | 11/2003 | Shirasawa et al. | | |
| 6,747,300 B2 * | 6/2004 | Nadd et al. | ............. | 257/288 |
| 2002/0153586 A1 * | 10/2002 | Majumdar et al. | ............. | 257/506 |

(Continued)

FOREIGN PATENT DOCUMENTS
EP 1 022 785 A1 7/2000
(Continued)

*Primary Examiner* — Fernado L Toledo
*Assistant Examiner* — John P Dulka
(74) *Attorney, Agent, or Firm* — Oblon, Spivak, McClelland, Maier & Neustadt, L.L.P.

(57) ABSTRACT

Each of first base regions of sequentially layered first IGBT and second IGBT has a peripheral section in the vicinity of the side face of the semiconductor substrate. Each of the IGBTs includes a P-type peripheral base region that is adjacent to the peripheral section of the first base region of the N-type to form a diode and a diode electrode that is formed on an upper face of the peripheral section of the first base region, thereby electrically connecting the diode electrode and a collector electrode of each of the IGBTs. When the semiconductor device is ON, current flows at the center side of the semiconductor substrate separated from the side face. When current in a reverse direction is generated when the semiconductor device is OFF, current in a reverse direction flows in the vicinity of the side face of the semiconductor substrate.

3 Claims, 3 Drawing Sheets

U.S. PATENT DOCUMENTS

2004/0169262 A1 * 9/2004 Oliver et al. .................. 257/676

FOREIGN PATENT DOCUMENTS

| EP | 1022785 A1 * | 7/2000 |
| --- | --- | --- |
| EP | 1231635 | 8/2002 |
| EP | 1 411 551 A1 | 4/2004 |
| EP | 1657750 A1 * | 5/2006 |
| JP | 62 219667 | 9/1987 |
| JP | 9 191110 | 7/1997 |
| JP | 2001 501043 | 1/2001 |
| JP | 2005 72519 | 3/2005 |
| WO | 2005 018001 | 2/2005 |
| WO | WO 2005018001 A1 * | 2/2005 |

* cited by examiner

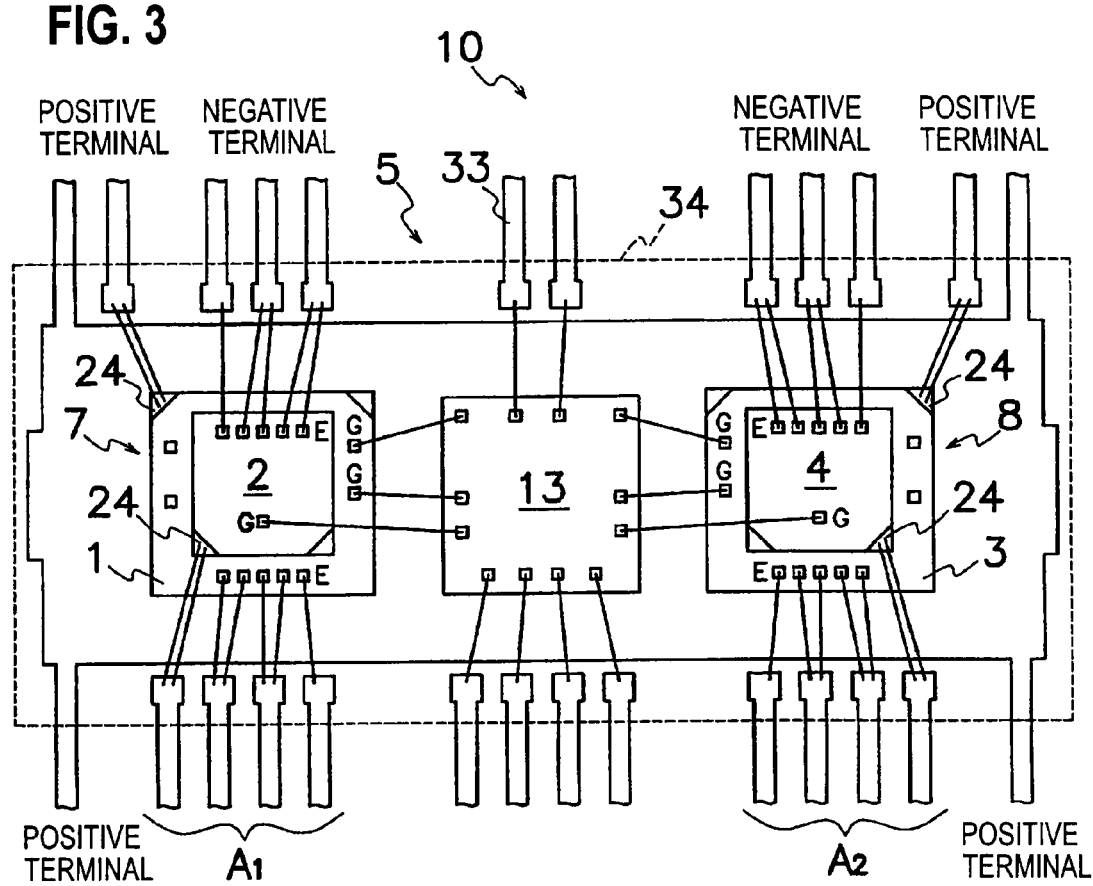
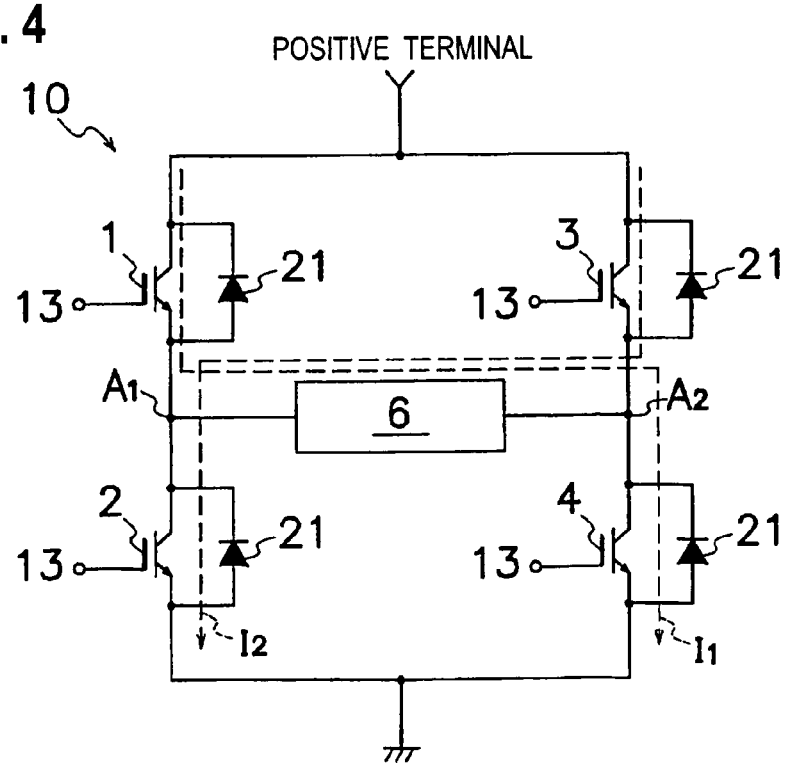

… (1)

SEMICONDUCTOR DEVICE HAVING A STACKED MULTI STRUCTURE THAT HAS LAYERED INSULATED GATE-TYPE BIPOLAR TRANSISTORS

TECHNICAL FIELD

The present invention relates to a semiconductor device including a plurality of layered semiconductor elements.

BACKGROUND ART

As a means for coping with electronic components having a smaller size in recent years, a semiconductor device has been used that uses a stacked multi structure in which switching elements are layered to constitute a bridge circuit. A semiconductor device using a stacked multi structure is known from the following Patent Publication 1 for example. According to the semiconductor device disclosed in Patent Publication 1, an H-type bridge circuit using a power semiconductor element can be formed with an improved integration degree while decreasing an area occupied by a supporting plate. However, when a MOS-type field effect transistor (MOSFET) is used for layering power semiconductor elements, the chip size is increased to prevent a smaller size from being achieved. Thus, an insulated gate-type bipolar transistor (IGBT) that can realize a smaller chip size has been used. However, the use of the IGBT additionally requires an external diode to be mounted in an H-type bridge circuit. This has consequently prevented a smaller size from being achieved and has caused an increased product cost due to the external diode.

Generally, MOSFET includes, as shown in FIG. 5 for example, a semiconductor substrate (50) including an N-type conductivity type drain region (51), a P-type conductivity type base region (52) formed on an upper face (51a) of a drain region (51), and an N-type conductivity type source region (53) formed on an upper face (52a) of a base region (52); a gate electrode (55) formed on an upper face (53a) of the source region (53) via a gate insulating film (54); a source electrode (56) formed on the base region (52) and an upper face (52a, 53a) of the source region (53); and a drain electrode (57) formed on a lower face (51b) of the drain region (51). Thus, the P-type conductivity type base region (52) and the N-type conductivity type drain region (51) have therebetween a diode (58) that can be used as an inner diode to be protected.

On the other hand, the IGBT has, as shown in FIG. 6, a semiconductor substrate (60) that has a P-type conductivity type collector region (61), a first base region (62) of N-type conductivity type that is formed on an upper face (61a) of the collector region (61), and a second base region (63) of P-type conductivity type that is formed on an upper face (62a) of the first base region (62), and an emitter region (64) of N-type conductivity type that is formed on an upper face (63a) of the second base region (63); a gate electrode (66) formed on an upper face (63a) of the second base region (63) via a gate insulating film (65); an emitter electrode (67) formed on an upper face (63a, 64a) of the second base region (63) and the emitter region (64); and a collector electrode (68) formed on a lower face (61b) of the collector region (61). Thus, the IGBT is structured as shown in FIG. 6 so that a diode (69) is each formed between the second base region (63) of P-type conductivity type and the first base region (62) of N-type conductivity type and between the collector region (61) of P-type conductivity type and the first base region (62) of N-type conductivity type, respectively. Thus, the diodes (69) having reverse polarities are series-connected. This has caused a difficulty where this diode cannot be used as an inner diode for protection of transistor. In an H-bridge circuit in which an output terminal is connected with a load having an induction component for example, a back electromotive force caused by the induction component of the load tends to be applied to the IGBT. Thus, each IGBT must be connected in parallel to the diode to bypass current in a reverse direction (surge current) caused by the electromotive force via the diode.

The following Patent Publication 2 discloses an IGBT in which the center of a collector region has a cathode region having an opposite conductivity type and the upper part of the cathode region has a P-type conductivity type anode region to store a diode. According to the IGBT of Patent Publication 2, an external diode can be omitted and a semiconductor device having a stacked multi structure having layered IGBT can be formed.

Patent Publication 1: International Publication Number WO 2005/018001
Patent Publication 2: Japanese Laid-Open Publication No. H9-191110

DISCLOSURE OF THE INVENTION

Problem to be Solved by the Invention

However, in the case of the IGBT of Patent Publication 2, an anode region and a cathode region must be superposed at an identical position in the plane direction of a semiconductor substrate. Thus, both of the semiconductor regions are difficulty aligned, causing a problem in the productivity. When the IGBT is turned ON, current flows in a cell region at the center of the semiconductor substrate. However, this current also flows in a reverse direction at the center of the semiconductor substrate even when current in a reverse direction is caused when the semiconductor device is turned OFF. This has caused a risk where heat caused by current is concentrated on the center of the semiconductor substrate to deteriorate an electrical characteristic of the semiconductor substrate.

Thus, it is an objective of the present invention to provide a semiconductor device having a stacked multi structure that has layered IGBTs including a diode, that has a smaller size than that of a conventional design, and that can be manufactured easily. Is it another objective of the present invention to provide a semiconductor device that prevents heat caused by current from being concentrated on the center of a semiconductor substrate.

Means for Solving the Problem

A semiconductor device of the present invention has a first semiconductor element and a second semiconductor element that is layered and fixed on the first semiconductor element. Each of the first semiconductor element and the second semiconductor element comprises: (i) a semiconductor substrate including a collector region of a first conductivity type (P/N), a first base region that has a second conductivity type (N/P) opposite to the first conductivity type and that is formed on an upper face of the collector region, a second base region that has the first conductivity type and that is formed to be adjacent to the first base region, and an emitter region that has the second conductivity type and that is formed to be adjacent to the second base region; (ii) a gate electrode formed on an upper face of the second base region via an insulating material; (iii) an emitter electrode formed on upper faces of the second base region and the emitter region; and (iv) a collector electrode formed on a lower face of the collector region. The first base region has a peripheral section in the vicinity of the side face of the semiconductor substrate. Each of the first semiconductor element and the second semiconductor element has a peripheral base region that has the first conductivity type and that is formed to be adjacent to a peripheral section of the first base region to form a diode and a diode electrode that is formed on an upper face of the peripheral section of the first base region. The diode electrode and the collector electrode of the first semiconductor element and the second semiconductor element are electrically connected, respectively.

In the first semiconductor element and the second semiconductor element, a back electromotive force due to an induction component of a load connected thereto causes reverse current (surge current) to be induced in a reverse direction from the emitter electrodes of the first semiconductor element and the second semiconductor element to the collector electrode. This reverse current can be caused to flow to the collector electrode via the flow peripheral base region, the peripheral section of the first base region, and the diode electrode by using the peripheral base region having the first conductivity type and the peripheral section of the first base region having the second conductivity type to form the diode so that the diode electrode formed on the upper face of the peripheral section is electrically connect with the collector electrode. Thus, it is not required to connect an external diode to the semiconductor device, thus allowing the semiconductor device to have a smaller size. When the semiconductor device is ON, current flows at the center side of the semiconductor substrate separated from the side face. When the semiconductor device is OFF and current in a reverse direction is generated, the reverse current flows in the vicinity of the side face of the semiconductor substrate. This can prevent a situation where heat generated by current is concentrated on the center side of the semiconductor substrate to cause a deteriorated electrical characteristic of the semiconductor substrate. Furthermore, the diode formed in the vicinity of the side face of the semiconductor substrate allows heat generated by current flowing in a reverse direction in the diode to be radiated through the side face of the semiconductor substrate in a favorable manner.

Effect of the Invention

According to the present invention, a semiconductor device having a stacked multi structure can be provided that has a smaller size and that is reliable.

BRIEF DESCRIPTION OF THE DRAWINGS

FIG. 3 is a plan view of FIG. 2.
FIG. 4 is a circuit diagram of FIG. 3.

Figure 1:
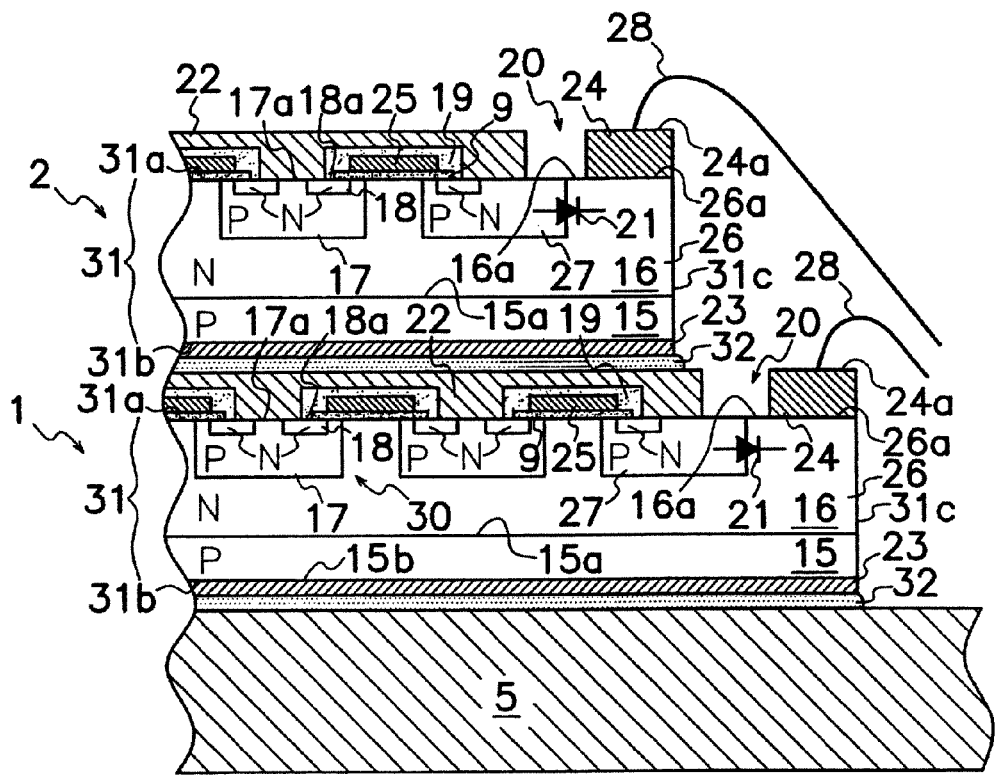
FIG. 1 is a partial expanded cross sectional view illustrating one embodiment of a semiconductor device according to the present invention.

EXPLANATION OF REFERENCE NUMERALS (1) First semiconductor element (the first IGBT)
(2) Second semiconductor element (the second IGBT)
(3) Third semiconductor element (the third IGBT)
(4) Fourth semiconductor element (the fourth IGBT)
(5) Supporting plate
(7) First semiconductor element layered structure
(8) Second semiconductor element layered structure
(9) Insulating material (gate insulating film)
(10) H-type bridge circuit
(13) Control element
(15) Collector region
(15a) Upper face
(15b) Lower face
(16) First base region
(16a) Upper face
(17) Second base region
(17a) Upper face
(18) Emitter region
(18a) Upper face
(21) Diode
(22) Emitter electrode
(23) Collector electrode
(24) Diode electrode
(25) Gate electrode
(26) Peripheral section
(26a) Upper face
(27) Peripheral base region
(31) Semiconductor substrate (semiconductor substrate)
(31c) Side face
(32) Adhesive agent

BEST MODE FOR CARRYING OUT THE INVENTION

The following section will describe, with reference to FIG. 1 to FIG. 4, one embodiment of a semiconductor device according to the present invention in which IGBT is used to constitute an H-type bridge circuit.

Figure 2:
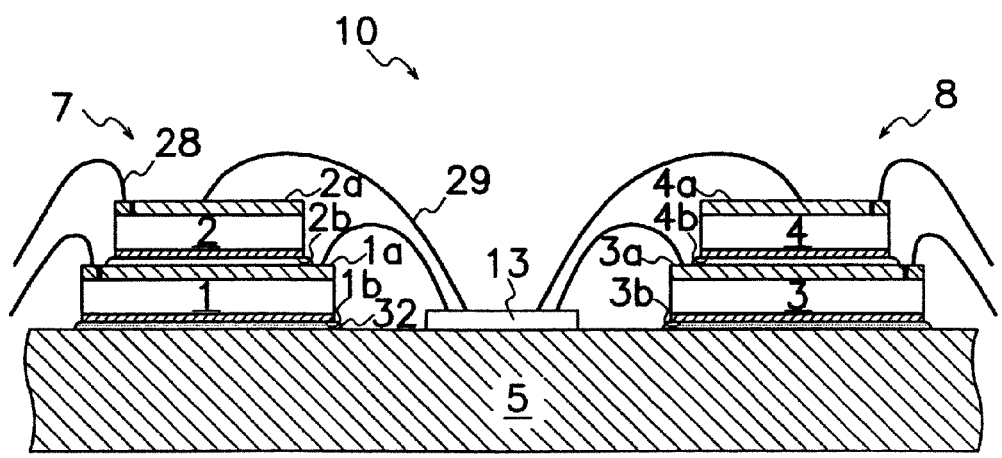
FIG. 2 is an overall view of FIG. 1.
Figure 5:
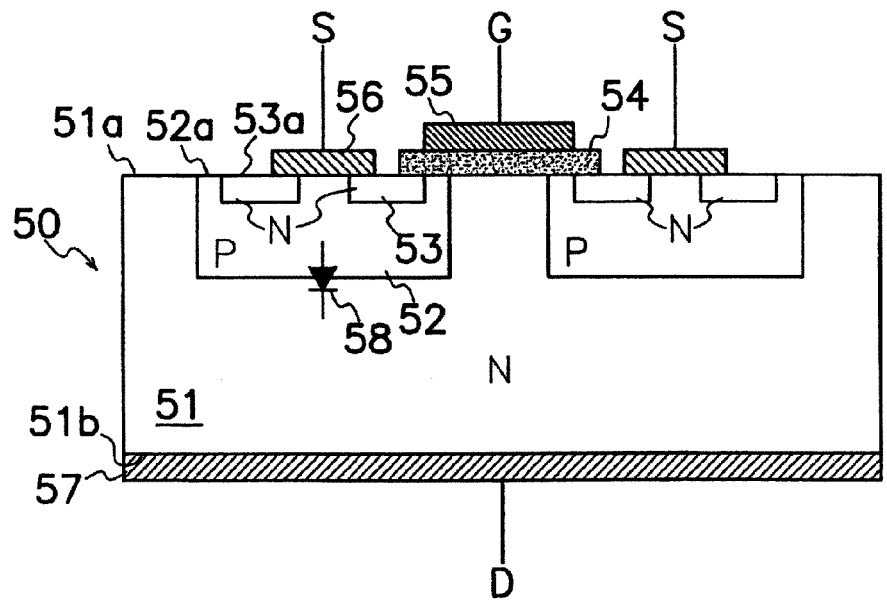
FIG. 5 is a cross-sectional view illustrating a conventional MOSFET.
Figure 6:
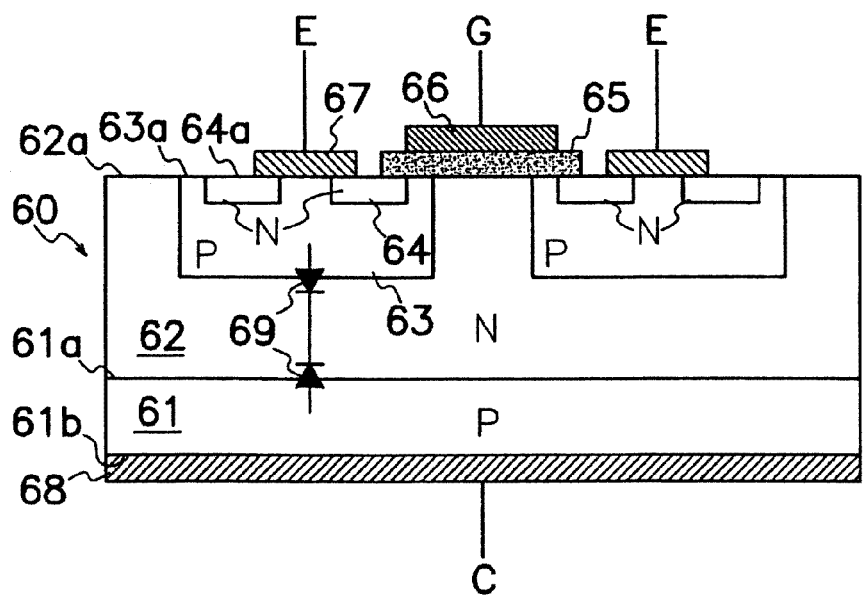
FIG. 6 is a cross-sectional view illustrating a conventional IGBT.

The semiconductor device of this embodiment includes, as shown in FIG. 1 to FIG. 3, the first semiconductor element layered structure (7) that has a supporting plate (5) made of metal having heat radiation (e.g., copper, aluminum) as well as the first insulated gate-type bipolar transistor (IGBT) (1) as the first semiconductor element and the second IGBT (2) as the second semiconductor element that are sequentially layered on the supporting plate (5); the second semiconductor element layered structure (8) that has the third IGBT (3) as the third semiconductor element and the fourth IGBT (4) as the fourth semiconductor element that are sequentially layered on and fixed to the supporting plate (5); and a control element (13) that controls a switching operation of the first IGBT (1) to the fourth IGBT (4). This semiconductor device has an H-type bridge circuit (10) shown in FIG. 4.

Upper face electrodes of the first IGBT (1) to the fourth IGBT (4) (emitter electrodes and gate electrodes) are connected to a plurality of external leads (33) provided around the upper face electrode (control electrode) or the supporting plate (5) of the control element (13) via a wire (lead fine wire) (29). A load (6) (e.g., cold cathode fluorescent discharge tube) is connected between a connection point ($A_1$) between an emitter electrode (22) of the first IGBT (1) and a collector electrode (23) of the second IGBT (2) and a connection point ($A_2$) between an emitter electrode (22) of the third IGBT (3) and a collector electrode (23) of the fourth IGBT (4). The semiconductor devices having the H-type bridge circuit (10) are covered by resin sealing material (34) for integration. However, the external lead (33) is derived from resin sealing material (34) to outside. This external lead (33) is partially connected with the load (6).

One of the first IGBT (1) and the second IGBT (2) of the first semiconductor element layered structure (7) and one of the third IGBT (3) and the fourth IGBT (4) of the second semiconductor element layered structure (8) make up a high-side switch of the H-type bridge circuit (10). The other of the first IGBT (1) and the second IGBT (2) of the first semiconductor element layered structure (7) and the other of the third IGBT (3) and the fourth IGBT (4) of the second semiconductor element layered structure (8) make up a low-side switch of the H-type bridge circuit (10). In this embodiment, the second IGBT (2) and the fourth IGBT (4) at the low side is fixed on the first IGBT (1) and the third IGBT (3) at the high side to constitute the first and second semiconductor element layered structures (7, 8). The first semiconductor element layered structure (7) and the second semiconductor element layered structure (8) are fixed by adhesive agent (32) consisting of solder, brazing filler metal, or silver paste to a single supporting plate (5) so that a control element (13) is provided between the first semiconductor element layered structure (7) and the second semiconductor element layered structure (8).

The second IGBT (2) and the fourth IGBT (4) have upper faces (2a, 4a) and lower faces (2b, 4b) whose plane areas are smaller than those of upper faces (1a, 3a) and lower faces (1b, 3b) of the first IGBT (1) and the third IGBT (3). As shown in FIG. 1, the first IGBT (1) to the fourth IGBT (4) include a semiconductor substrate (31) as a semiconductor substrate that consists of silicon single crystal for example. Each of the semiconductor substrates (31) includes: a collector region (15) of the P-type conductivity type as the first conductivity type; the first base region (16) that is of the N-type conductivity type as the second conductivity type opposite to the P-type conductivity type and that is formed on an upper face (15a) of the collector region (15); the second base region (17) that is of the P-type conductivity type and that is formed at the upper face (16a) side to be adjacent to the first base region (16); and an emitter region (18) that is of the N-type conductivity type and that is formed at the upper face (17a) side to be adjacent to the second base region (17).

Each of the first IGBT (1) to the fourth IGBT (4) includes: a gate electrode (control electrode) (25) that is formed on the upper face (17a) of the second base region (17) via a gate insulating film (9) as an insulating material; emitter electrodes (upper face electrodes) (22) formed on the upper faces (17a, 18a) of the second base region (17) and the emitter region (18); and a collector electrode (bottom face electrode) (23) formed on the lower face (15b) of the collector region (15), respectively. The second base region (17) sandwiched between the emitter region (18) and the first base region (16) has thereon a gate electrode (25) formed via the gate insulating film (9) that forms the well-known channel region.

The second base regions (17) are arranged in the first base region (16) in the plane direction of the semiconductor substrate (31) in a grid-like or stripe-like manner. The emitter regions (18) are arranged so as to be opposed to each other along the edge of the second base region (17). The gate electrodes (25) are formed in a stripe-like manner among the second base regions (17) so as to bridge the second base regions (17) neighboring to each other. As a result, cells (30) are formed as the minimum unit of active regions of the semiconductor element. The second base region (17) also may be formed to have an island-like shape in the first base region (16). Although not shown, the upper face (31a) of the semiconductor substrate (31) includes a gate bus line electrically connected to the gate electrode (25) so that the gate bus line is formed along the periphery face of the semiconductor substrate (31). (31b) is a lower face of the semiconductor substrate (31). The gate bus line is made of electrically-conductive metal such as aluminum and covers an extended section of the stripe-like gate electrode (25) to be electrically connected to the gate electrode (25).

The electrically-conductive adhesive agent (32) electrically connects an emitter electrode (22) of the first IGBT (1) to a collector electrode (23) of the second IGBT (2) and also electrically connects the emitter electrode (22) of the third IGBT (3) to the collector electrode (23) of the fourth IGBT (4). The gate insulating film (9) is made of silicon dioxide for example. The upper face of the gate insulating film (9) has thereon the gate electrode (25) made of polysilicon of for example. The gate electrode (25) is surrounded by an interlayer insulating film (19) that provides an electrical insulation between the gate electrode (25) and the emitter electrode (22) and that is made of silicon dioxide for example. The emitter electrode (22) and the collector electrode (23) have a layered structure in which aluminum or aluminum and nickel is/are layered.

As shown in FIG. 1, the first base region (16) of each of the IGBTs (1, 2, 3, 4) has a peripheral section (26) in the vicinity of the side face (31c) of the semiconductor substrate (31). A P-type conductivity type peripheral base region (27) is formed to be adjacent to the peripheral section (26) of the first base region (16). By this peripheral base region (27), a diode (21) is formed in the vicinity of the side face (31c) of the semiconductor substrate (31). In the shown semiconductor device, the second base region (17) and the emitter region (18) are formed at the center of the element so as to be separated from two side faces (31c) forming one corner of the semiconductor substrate (31). The peripheral section (26) of the first base region (16) and the peripheral base region (27) are formed so as to be adjacent to the two side faces (31c) of the semiconductor substrate (31). Specifically, each of the IGBTs (1, 2, 3, 4) shown in FIG. 1 has: an annular peripheral section (26) formed at the side face (31c) of the semiconductor substrate (31); and a center section that is surrounded by this peripheral section (26) and that is provided at the center of the element. The peripheral section (26) includes the diode (21) and the center section includes a cell (30). The peripheral base region (27) can be formed together with the second base region (17) by diffusing impurity such as boron over the upper face (31a) of the semiconductor substrate (31)

Thus, the peripheral base region (27) can be formed by the same manufacture steps as the existing ones without increasing the manufacturing cost. In this embodiment, the side of the peripheral base region (27) opposed to the second base region (17) has the emitter region (18). However, the peripheral base region (27) may not require the emitter region (18) therein.

A diode electrode (24) is provided that is formed on the upper face (26a) of the peripheral section (26) of the first base region (16). In the shown semiconductor device, while the gate electrode (25) and the emitter electrode (22) are formed to be separate from two side faces (31c) of the semiconductor substrate (31), the diode electrode (24) is formed to be adjacent to two side faces (31c) of the semiconductor substrate (31). The diode electrode (24) and the emitter electrode (22) have therebetween a gap (20) to electrically separate the diode electrode (24) from the emitter electrode (22). In order to improve the insulation between the diode electrode (24) and the emitter electrode (22), the diode electrode (24) and the emitter electrode (22) may have therebetween an insulating film (not shown) made of silicon dioxide. The insulating film can be formed together with the interlayer insulating film (19) in a step of forming the interlayer insulating film (19). The diode electrode (24) is made of aluminum or silicon-containing aluminum that has high adhesiveness with aluminum forming a wire (28) for example. The diode electrode (24) has a flat upper face (24a) and is connected to the supporting plate (5) or the external lead (33) that also has an upper face via the wire (28) by the well-known wire bonding method.

A step of connecting the diode electrode (24) to the external lead (33) via the wire (28) can be performed simultaneously with a step of connecting the upper face electrodes of the first IGBT (1) to the fourth IGBT (4) to the upper face electrode of the control element (13) or the external lead (33) via a wire (29). Thus, the semiconductor device can be manufactured by the same manufacture step as the existing one without causing an increased manufacture cost.

The diode electrodes (24) and the collector electrodes (23) of the first IGBT (1) to the fourth IGBT (4) are electrically connected to one another, respectively. As shown in FIG. 4, diodes are connected in parallel with IGBTs (1, 2, 3, 4) between emitters and connectors thereof. The first IGBT (1) and the third IGBT (3) make up a high-side switch connect the external lead (33) connected to a positive terminal to the diode electrode (24) via the wire (28) to electrically connect the diode electrode (24) to the collector electrode (23) through another external lead (33) connected to a positive terminal and the supporting plate (5). The second IGBT (2) and the fourth IGBT (4) make up a low-side switch connect the external lead (33) connected to a connection point (A, A) to the diode electrode (24) via the wire (28) to electrically connect the diode electrode (24) to the collector electrode (23) via another external lead (33) connected to the connection point (A, A) and the wire (29).

In the first IGBT (1) to the fourth IGBT (4), a back electromotive force by an induction component of the load (6) connected to the H-type bridge circuit (10) causes reverse current (surge current) induced in a reverse direction from the emitter electrode (22) of each of the IGBTs (1, 2, 3, 4) to the collector electrode (23). This reverse current can be caused to flow in the collector electrode (23) through the peripheral base region (27), the peripheral section (26) of the first base region (16), and the diode electrode (24) by using the peripheral base region (27) of the P-type conductivity type and the peripheral section (26) of the first base region (16) of the N-type conductivity type to form the diode (21) to electrically connect the diode electrode (24) formed on the upper face (26a) of the peripheral section (26) to the collector electrode (23). Thus, it is not required to connect an external diode to the semiconductor device, thus allowing the semiconductor device having the H-type bridge circuit (10) to have a smaller size.

In order to operate the H-type bridge circuit (10), the control element (13) can be used to alternately turn ON and OFF a combination of the first IGBT (1) and the fourth IGBT (4) and a combination of the second IGBT (2) and the third IGBT (3) for switching operation to alternately flow currents (11, 12) in reverse directions between connection points ($A_1$) and ($A_2$), thereby operating the load (6). When the combination of the first IGBT (1) and the fourth IGBT (4) is ON, the combination of the second IGBT (2) and the third IGBT (3) is OFF to cause the current ($I_1$) in one direction to pass through the load (6). Thereafter, the combination of the first IGBT (1) and the fourth IGBT (4) is turned OFF. When the combination of the second IGBT (2) and the third IGBT (3) is turned ON, the current ($I_2$) in another direction is caused to pass through the load (6) to operate the load (6) by alternating current. The current ($I_1$) in one direction passes through the first IGBT (1), the fourth IGBT (4), and the supporting plate (5) while the current ($I_2$) in another direction passes through the second IGBT (2), the third IGBT (3), and the supporting plate (5).

As described above, the first IGBT (1) to the fourth IGBT (4) can be subjected to a switching operation and a DC voltage source can be used to light a cold cathode fluorescent discharge tube connected between the connection points ($A_1$) and ($A_2$). When the semiconductor device is ON, current flows at the center side of the semiconductor substrate (31) separated from the side face (31c). When current in a reverse direction is caused while the semiconductor device being OFF, current in a reverse direction flows in the vicinity of the side face (31c) of the semiconductor substrate (31). Thus, a current path through which ON current passes can be separated from a current path through which surge current passes. This can prevent a situation where heat caused by current is concentrated on the center side of the semiconductor substrate (31) to cause a deteriorated electrical characteristic of the semiconductor substrate (31). Furthermore, by the diode (21) formed in the vicinity of the side face (31c) of the semiconductor substrate (31), heat causes at the diode (21) by current in a reverse direction is radiated to outside through the side face (31c) of the semiconductor substrate (31) in a favorable manner. In the shown H-type bridge circuit (10), when the combination of the first IGBT (1) and the fourth IGBT (4) is turned ON and the combination of the second IGBT (2) and the third IGBT (3) is turned OFF, current passes through the center side of the semiconductor substrate (31) having the first IGBT (1) and the fourth IGBT (4). Then, when the combination of the second IGBT (2) and the third IGBT (3) is turned ON and the combination of the first IGBT (1) and the fourth IGBT (4) is turned OFF, a voltage in a reverse direction is applied to the first IGBT (1) and the fourth IGBT (4). Surge current based on this voltage in a reverse direction passes through the bypass of the diode (21) stored in the semiconductor substrate (31) having the first IGBT (1) and the fourth IGBT (4). It is noted that this current passes through the vicinity of the side face (31c) of the semiconductor substrate (31) as described above.

Embodiments of the present invention are not limited to the above embodiment and can be changed in various ways. For example, although the semiconductor device shown in FIG. 1 is structured so that the peripheral base region (27) is formed at the corner of the semiconductor substrate (31), the peripheral base region (27) also may be formed in the vicinity of the side face (31c) separated from the corner.

INDUSTRIAL APPLICABILITY

The present invention can be favorably used for a semiconductor device in which a plurality of semiconductor elements are layered and a semiconductor device constituting an H bridge circuit (full bridge circuit) used for a driving device of a cold cathode fluorescent discharge tube for example.

The invention claimed is:
1. A semiconductor device, comprising:
a first semiconductor element layered on a second semiconductor element, an entire length of the first semiconductor element is adhered to and abutting the second semiconductor element,
each of the first semiconductor element and the second semiconductor element comprising:
a semiconductor substrate having
a collector region of a first conductivity type,
a first base region that has a second conductivity type opposite to the first conductivity type and that is formed on an upper face of the collector region,
a second base region that has the first conductivity type and that is formed to be adjacent to the first base region, and an emitter region that has the second conductivity type and that is formed to be adjacent to the second base region;

a gate electrode formed on an upper face of the second base region via an insulating material;

an emitter electrode formed on upper faces of the second base region and the emitter region; and a collector electrode formed on a lower face of the collector region, wherein the first base region has a peripheral section in the vicinity of a side face of the semiconductor substrate, each of the first semiconductor element and the second semiconductor element has a peripheral base region of the first conductivity type being formed adjacent to the first base region to form a diode, and a diode electrode being formed on an upper face of the peripheral section of the first base region;

the diode electrode and the collector electrode of the first semiconductor element are electrically connected to each other, and the diode electrode and the collector electrode of the second semiconductor element are electrically connected to each other, the emitter electrode of the first semiconductor element is electrically connected to the collector electrode of the second semiconductor element, so that upon alternately subjecting the first semiconductor element and the second semiconductor element to a switching operation, a current flows at a center side of the semiconductor substrate separated from the side face, a reverse current flows in the vicinity of the side face of the semiconductor substrate, when the semiconductor device is inoperative, and wherein the peripheral base region is formed at a corner of the semiconductor substrate.

2. A semiconductor device, comprising:

a supporting plate as a heat radiator;

a first semiconductor element layered structure having a first semiconductor element and a second semiconductor element that are sequentially layered and fixed on the supporting plate, an entire length of the second semiconductor element is adhered to and abutting the first semiconductor element;

a second semiconductor element layered structure having a third semiconductor element and a fourth semiconductor element that are sequentially layered and fixed on the supporting plate, an entire length of the fourth semiconductor element is adhered to and abutting the third semiconductor element; and a control element that controls a switching operation of the first semiconductor element to the fourth semiconductor element, each of the first semiconductor element to the fourth semiconductor element including a semiconductor substrate having a collector region of a first conductivity type, a first base region that has a second conductivity type opposite to the first conductivity type and that is formed on an upper face of the collector region, a second base region that has the first conductivity type and that is formed to be adjacent to the first base region, and an emitter region that has the second conductivity type and that is formed to be adjacent to the second base region, a gate electrode formed on an upper face of the second base region via an insulating material, an emitter electrode formed on upper faces of the second base region and the emitter region, and a collector electrode formed on a lower face of the collector region, wherein the first base region has a peripheral section in the vicinity of a side face of the semiconductor substrate, each of the first semiconductor element to the fourth semiconductor element includes a peripheral base region that has the first conductivity type and that is formed to be adjacent to the first base region to form a diode, and a diode electrode that is formed on an upper face of the peripheral section of the first base region, and the diode electrode and the collector electrode of the first semiconductor element are electrically connected to each other, the diode electrode and the collector electrode of the second semiconductor element are electrically connected to each other, the diode electrode and the collector electrode of the third semiconductor element are electrically connected to each other, the diode electrode and the collector electrode of the fourth semiconductor element are electrically connected to each other, the emitter electrode of the first semiconductor element is electrically connected to the collector electrode of the second semiconductor element, the emitter electrode of the third semiconductor element is electrically connected to the collector electrode of the fourth semiconductor element, so that upon alternately subjecting a combination of the first semiconductor element and the fourth semiconductor element and a combination of the second semiconductor element and the third semiconductor element to a switching operation, a current flows at a center side of the semiconductor substrate separated from the side face, and a reverse current flows in the vicinity of the side face of the semiconductor substrate, when the semiconductor device is inoperative, and wherein the peripheral base region is formed at a corner of the semiconductor substrate.

3. The semiconductor device according to claim 2, wherein the first semiconductor element and the second semiconductor element of the first semiconductor element layered structure and the third semiconductor element and the fourth semiconductor element of the second semiconductor element layered structure make up an H-type bridge circuit, one of the first semiconductor element and the second semiconductor element of the first semiconductor element layered structure and one of the third semiconductor element and the fourth semiconductor element of the second semiconductor element layered structure make up a high-side switch of the H-type bridge circuit, and the other of the first semiconductor element and the second semiconductor element of the first semiconductor element layered structure and the other of the third semiconductor element and the fourth semiconductor element of the second semiconductor element layered structure make up a low-side switch of the H-type bridge circuit.

* * * * *